United States Patent
Zhang

(10) Patent No.: US 7,375,411 B2
(45) Date of Patent: May 20, 2008

(54) METHOD AND STRUCTURE FOR FORMING RELATIVELY DENSE CONDUCTIVE LAYERS

(75) Inventor: Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/860,081

(22) Filed: Jun. 3, 2004

(65) Prior Publication Data

US 2005/0269668 A1     Dec. 8, 2005

(51) Int. Cl.
*H01L 3/52* (2006.01)

(52) U.S. Cl. .................. 257/531; 257/508; 257/659; 257/700; 257/773

(58) Field of Classification Search .......... 257/532, 257/508, 531, 659, 700, 773
See application file for complete search history.

(56) References Cited

U.S. PATENT DOCUMENTS

| | | |
|---|---|---|
| 5,083,236 A | 1/1992 | Chason et al. |
| 5,446,311 A | 8/1995 | Ewen et al. |
| 5,459,368 A | 10/1995 | Onishi et al. |
| 5,461,353 A | 10/1995 | Eberhardt |
| 5,559,360 A | 9/1996 | Chiu et al. |
| 5,760,456 A | 6/1998 | Grzegorek et al. |
| 5,793,272 A | 8/1998 | Burghartz et al. |
| 5,884,990 A | 3/1999 | Burghartz et al. |
| 5,918,121 A | 6/1999 | Wen et al. |
| 5,959,515 A | 9/1999 | Cornett et al. |
| 5,959,522 A | 9/1999 | Andrews |
| 6,008,102 A | 12/1999 | Alford et al. |
| 6,037,649 A | 3/2000 | Liou |
| 6,046,109 A | 4/2000 | Liao et al. |
| 6,054,329 A | 4/2000 | Burghartz et al. |
| 6,114,937 A | 9/2000 | Burghartz et al. |
| 6,124,624 A | 9/2000 | Van Roosmalen et al. |
| 6,146,958 A | 11/2000 | Zhao et al. |
| 6,153,489 A | 11/2000 | Park et al. |
| 6,169,008 B1 | 1/2001 | Wen et al. |
| 6,218,729 B1 | 4/2001 | Zavrel, Jr. et al. |
| 6,362,525 B1 | 3/2002 | Rahim |

(Continued)

FOREIGN PATENT DOCUMENTS

EP     0 675 539 A2     10/1995

(Continued)

OTHER PUBLICATIONS

"Unitive—CPS On the Edge", Unitive Inc. 2003 (from website—http://www.unitive.com/cspedge/index.cfm), 2 pages.

(Continued)

*Primary Examiner*—Edward Wojciechowicz
(74) *Attorney, Agent, or Firm*—Zagorin O'Brien Graham LLP

(57) ABSTRACT

A region of high metal density may be placed in metal layers proximate to an area of low metal density below an inductor on an integrated circuit without violating manufacturing design rules for reducing manufacturing defects and without substantially impacting performance of the inductor. These results are achieved by including a transitional region that includes conductive structures electrically isolated from each other between the region of high metal density and the region of low metal density. The transitional region has a structure that allows a negligible amount of current flow to be induced in the structure.

32 Claims, 5 Drawing Sheets

U.S. PATENT DOCUMENTS

| | | | |
|---|---|---|---|
| 6,373,369 | B2 | 4/2002 | Huang et al. |
| 6,389,691 | B1 | 5/2002 | Rinne et al. |
| 6,486,534 | B1 | 11/2002 | Sridharan et al. |
| 6,501,169 | B1 | 12/2002 | Aoki et al. |
| 6,534,843 | B2 | 3/2003 | Acosta et al. |
| 6,600,208 | B2 | 7/2003 | Brennan et al. |
| 6,653,557 | B2 | 11/2003 | Wolf et al. |
| 6,847,282 | B2 | 1/2005 | Gomez et al. |
| 6,873,065 | B2 | 3/2005 | Haigh et al. |
| 6,900,087 | B2 | 5/2005 | Lowther et al. |
| 2002/0109204 | A1 | 8/2002 | Acosta et al. |
| 2002/0140081 | A1* | 10/2002 | Chou et al. ............ 257/700 |
| 2004/0222478 | A1 | 11/2004 | Zhang et al. |

FOREIGN PATENT DOCUMENTS

WO    WO 02/067326 A2    8/2002

OTHER PUBLICATIONS

"Unitive Design Guidelines", www.unitive.com, 2001, pp. 1-18.

Frommberger, Michael, et al., "Integration of Crossed Anisotropy Magnetic Core Into Toroidal Thin-Film Inductors," IEEE Transactions on Microwave Theory and Techniques, vol. 53, No. 6, Jun. 2005, pp. 2096-2100.

Kim, Sung-Jin, et al., "Realization of High-Q Inductors Using Wirebonding Technology," School of Electronics Engineering, Ajou University, AP-ASIG Proceedings, Aug. 1999, 4 pages.

Long, John R. and Miles A. Copeland, "The Modeling, Characterization, and Design of Monolithic Inductors for Silicon RF IC's," IEEE Journal of Solid-State Circuits, vol. 32, No. 3, Mar. 1997, pp. 357-369.

Soh, H. T., et al., "Through-Wafer Vias (TWV) and their Applications in 3 Dimensional Structures," Proceedings of 1998 International Conference on Solid State Devices and Materials, Sep. 1998, 12 pages.

Tang, Chih-Chun, et al., "Miniature 3-D Inductors in Standard CMOS Process," IEEE Journal of Solid-State Circuits, vol. 37, No. 4, Apr. 2002, pp. 471-480.

Treleaven, Dave and Dick James, "Integrated Circuit Passive Components," Whitepapers, Chipworks, www.chipworks.com/resources/resources_whitepapers.asp, 4 pages.

Tsui, Hau-Yiu and Jack Lau, 2003 IEEE MTT-S Digest, pp. 225-228.

Wu, Joyce H., et al., "A Through-Wafer Interconnect in Silicon for RFICs," IEEE Transactions on Electron Devices, vol. 51, No. 11, Nov. 2004, pp. 1765-1771.

Zannoth, Markus, et al., "A Fully Integrated VCO at 2 GHz," IEEE Journal of Solid-State Circuits, vol. 33, No. 12, Dec. 1998, pp. 1987-1991.

Zou, Jun, et al., Development of Vertical Planar Coil Inductors Using Plastic Deformation Magnetic Assembly (PDMA), 2001 IEEE International Mirowave Symposium, May 2001, 4 pages.

Chang, J.Y.-C. et al., "Large Suspended Inductors on Silicon and Their Use in a 2-μm CMOS RF Amplifier," IEEE Electron Device Letters, vol. 14, No. 5, May 1993, pp. 246-248.

Larson, Lawrence and Jessie, Darryl, "Advances in RF Packaging Technologies for Next-Generation Wireless Communications Applications (Invited Paper)," in Proceedings of the Custom Integrated Circuits Conference, IEEE, 8 pages, Sep. 21-24, 2003.

* cited by examiner

METHOD AND STRUCTURE FOR FORMING RELATIVELY DENSE CONDUCTIVE LAYERS

CROSS-REFERENCE TO RELATED APPLICATION(S)

BACKGROUND

1. Field of the Invention The present invention relates to integrated circuits, and more particularly to such integrated circuits incorporating inductors.

2. Description of the Related Art

An inductor formed on an integrated circuit is generally susceptible to performance degradation due to electromagnetic coupling of conductive structures near the inductor. In designs particularly sensitive to inductor performance, the impact of the coupling from these electromagnetic signals may be lessened by reducing or eliminating structures that affect performance. Accordingly, a design may reduce or eliminate conductive structures near an inductor, generating areas of the integrated circuit having a low metal density extending from the inductor through one or more integrated circuit layers. Unfortunately, in some integrated circuit manufacturing processes, areas of high metal density adjacent to areas of low metal density, in the same or even different metal layers, may have increased susceptibility to manufacturing defects and violate design rules implemented to reduce the impact of these defects in the particular process.

Accordingly, a technique is desired for forming high metal density integrated circuit structures near areas of low metal density without a significant impact on performance of nearby inductors and without violating design rules for a given manufacturing process.

SUMMARY

A high metal density region may be placed in metal layers proximate to an area of low metal density extending from an inductor through multiple integrated circuit layers without violating manufacturing design rules for reducing manufacturing defects and without substantially impacting performance of the inductor. These results are achieved by including a transitional region between the region of high metal density and the region of low metal density. The transitional region has a structure that allows at most a negligible amount of current flow to be induced in the structure.

In some embodiments of the present invention, an integrated circuit includes an inductor, a region of high conductor density, a region of low conductor density, and one or more transitional regions. The region of low conductor density is adjacent to the region of high conductor density and extends from the inductor through a plurality of integrated circuit layers. The one or more transitional regions are between the region of high conductor density and the region of low conductor density. At least one of the transitional regions includes a plurality of conductor structures electrically isolated from each other.

In some embodiments of the present invention, a method includes providing at least one transitional region of an integrated circuit between a region of low conductor density on the integrated circuit and a region of high conductor density on the integrated circuit. The method includes inducing substantially no current in the transitional region in response to an electromagnetic field generated by an inductor proximate to the transitional region.

In some embodiments of the present invention, a method of manufacturing an integrated circuit product includes forming an inductor, forming a region of high conductor density, forming a region of low conductor density, and forming one or more transitional regions. The region of low conductor density is adjacent to the region of high conductor density and extends from the inductor through a plurality of integrated circuit layers. The transitional region is between the region of high conductor density and the region of low conductor density and at least one of the transitional regions includes a plurality of conductor structures electrically isolated from each other.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
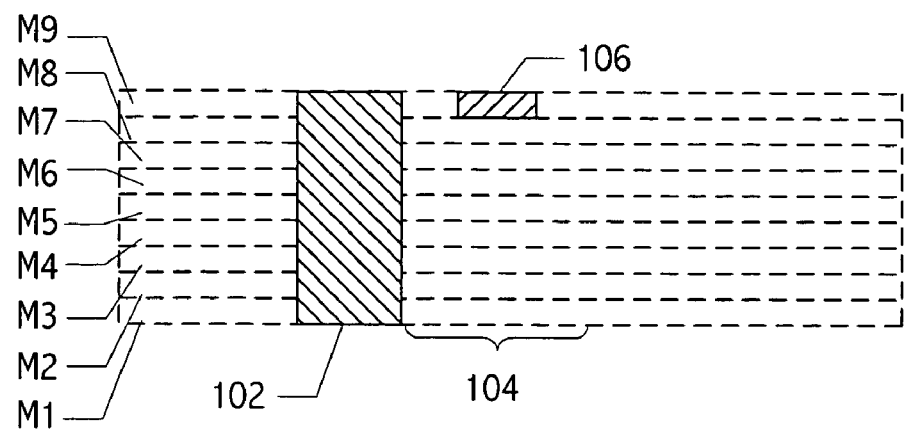
FIG. 1 is a cross-sectional view of an exemplary integrated circuit structure.

Referring to FIG. 1, an exemplary inductor (e.g., inductor 106) and a region of high conductor density (e.g., region 102), are formed in a typical integrated circuit manufacturing process. A region of high conductor density is a region including conductive structures. For example, an integrated circuit manufacturing process may require that conductive layers have a conductor density ranging from 20 to 80%. The density requirements will depend upon a particular manufacturing process. Typical conductors are formed of metals such as copper or aluminum. A volume of space beneath inductor 106, e.g., region 104, is void of conductive structures, i.e., the space is a region of low metal density included to prevent the electromagnetic field of the inductor from inducing a current in a metal structure that generates an electromagnetic field that counteracts the field of the inductor.

Figure 2:
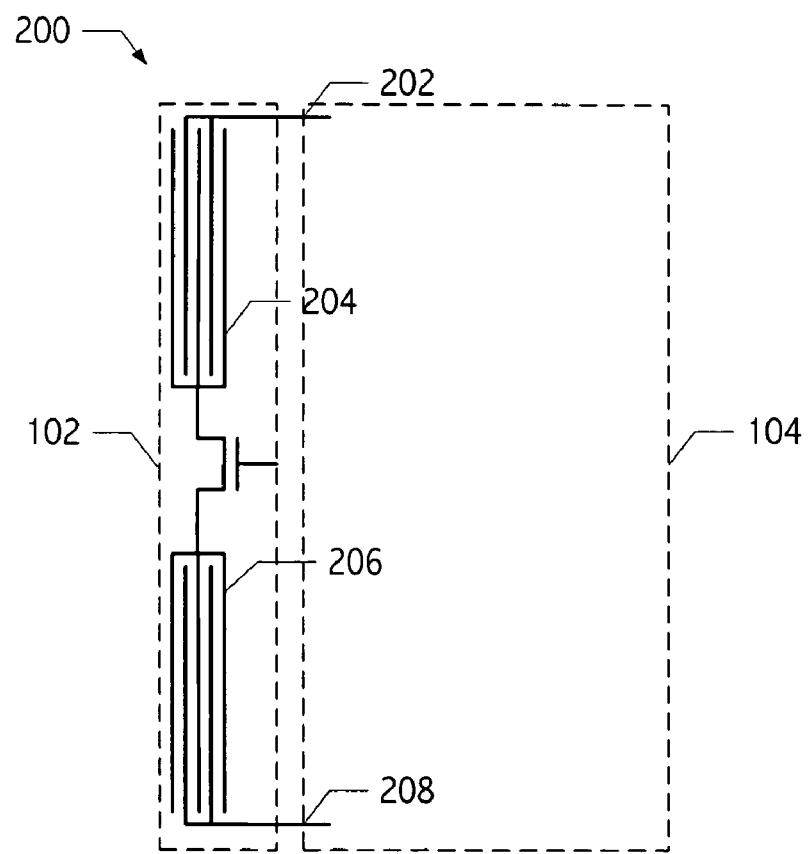
FIG. 2 illustrates an exemplary integrated circuit structure.

One structure that may be formed in high density metal region is a capacitor shown in FIG. 2. Typical integrated circuit capacitors, i.e., "finger" capacitors, are formed by a plurality of densely-spaced, substantially parallel metal lines, i.e., "fingers." Alternating ones of the fingers are coupled to form the plates of the capacitor. In an exemplary embodiment, (see, e.g., FIG. 2) the capacitors are formed in a region of high metal density 102. In one embodiment of the present invention, the finger capacitors extend from a second metal layer (e.g., M2) to a seventh metal layer (e.g., M7).

However, structures may be formed in any combination of conductive layers (e.g., M1-M9). Forming regions of high metal density (e.g., the structures formed by plates 202, 204, 206, and 208) next to a region of low metal density (e.g., region of low metal density 104) may violate design rules implemented for manufacturability in some integrated circuit manufacturing processes and/or lead to an unacceptable level of manufacturing defects particularly in the edge of the high density region that is closest to the low density region.

Figure 3:
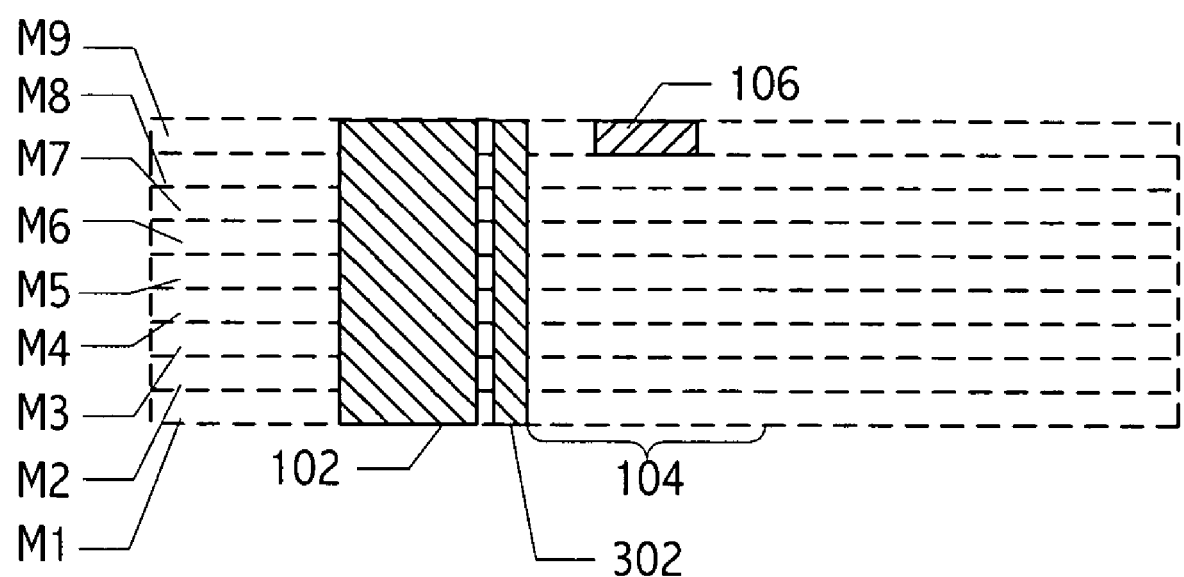
FIG. 3 is a cross-sectional view of an exemplary integrated circuit structure in accordance with an embodiment of the present invention.
Figure 4:
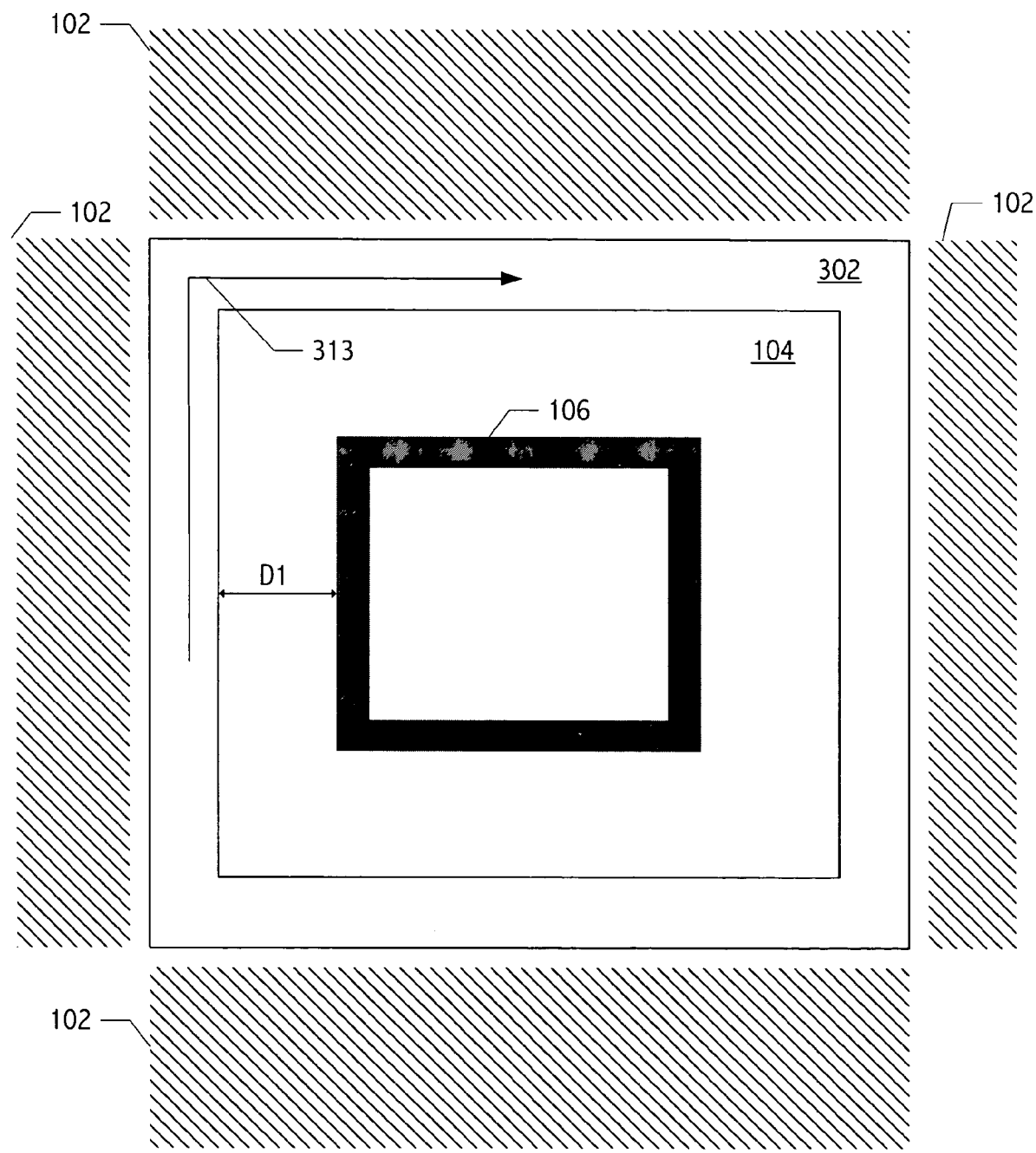
FIG. 4 illustrates a top-down view of an exemplary integrated circuit structure having a transition region formed by a solid conductor region.

One technique for addressing such defects, illustrated in FIGS. 3-4, includes providing a transitional region of metal, e.g., transitional region 302, between region of high metal density 102 and region of low metal density 104. FIG. 3 illustrates a side view of an integrated structure having transitional region 302, which may occupy a single metal layer (e.g., M1) or may extend vertically across multiple metal layers (e.g., M1-M9, as shown). Referring to FIG. 4, transitional region 302 is formed by a metal structure, formed in the same metal layer as a region of high metal density. Referring to FIG. 4, conductive structure 302 is a substantially solid metal structure that provides a protective barrier between region of high conductor density 102 and region of low metal density 104 such that manufacturing defects for edges of high density metal regions near low density regions are reduced or eliminated.

However, since metal structure 302 provides a path for current to flow, a current 313 may be induced in metal structure 302 in response to inductor 106. The induced current may generate an electromagnetic field that reduces a quality factor (i.e., Q) associated with inductor 106, changes the effective inductance of inductor 106, or otherwise affects performance of inductor 106, which in some applications (e.g., phase-locked loops), may result in an unacceptable degradation in circuit performance. Metal structure 302 may be formed far enough away from the inductor, e.g., distance D1, so that any current induced in metal structure 302 (e.g., in response to the inductor or otherwise) generates an electromagnetic field having a negligible effect on inductor 106. However, such spacing between metal structure 302 and inductor 106 generally results in wasted regions of the integrated circuit die in which other integrated circuit components cannot be placed.

Figure 5:
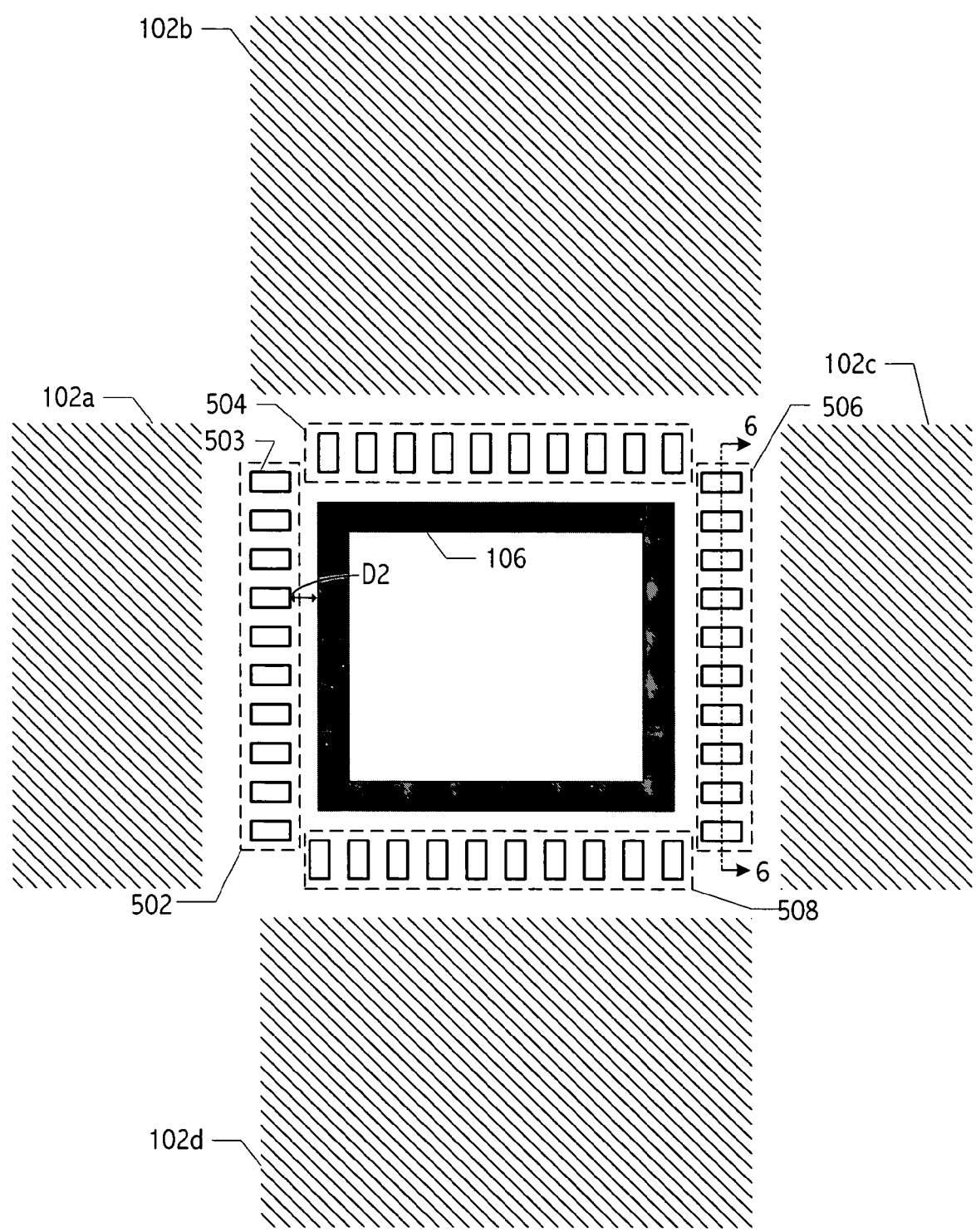
FIG. 5 illustrates a top-down view of an exemplary integrated circuit structure in accordance with an embodiment of the present invention.
Figure 6:
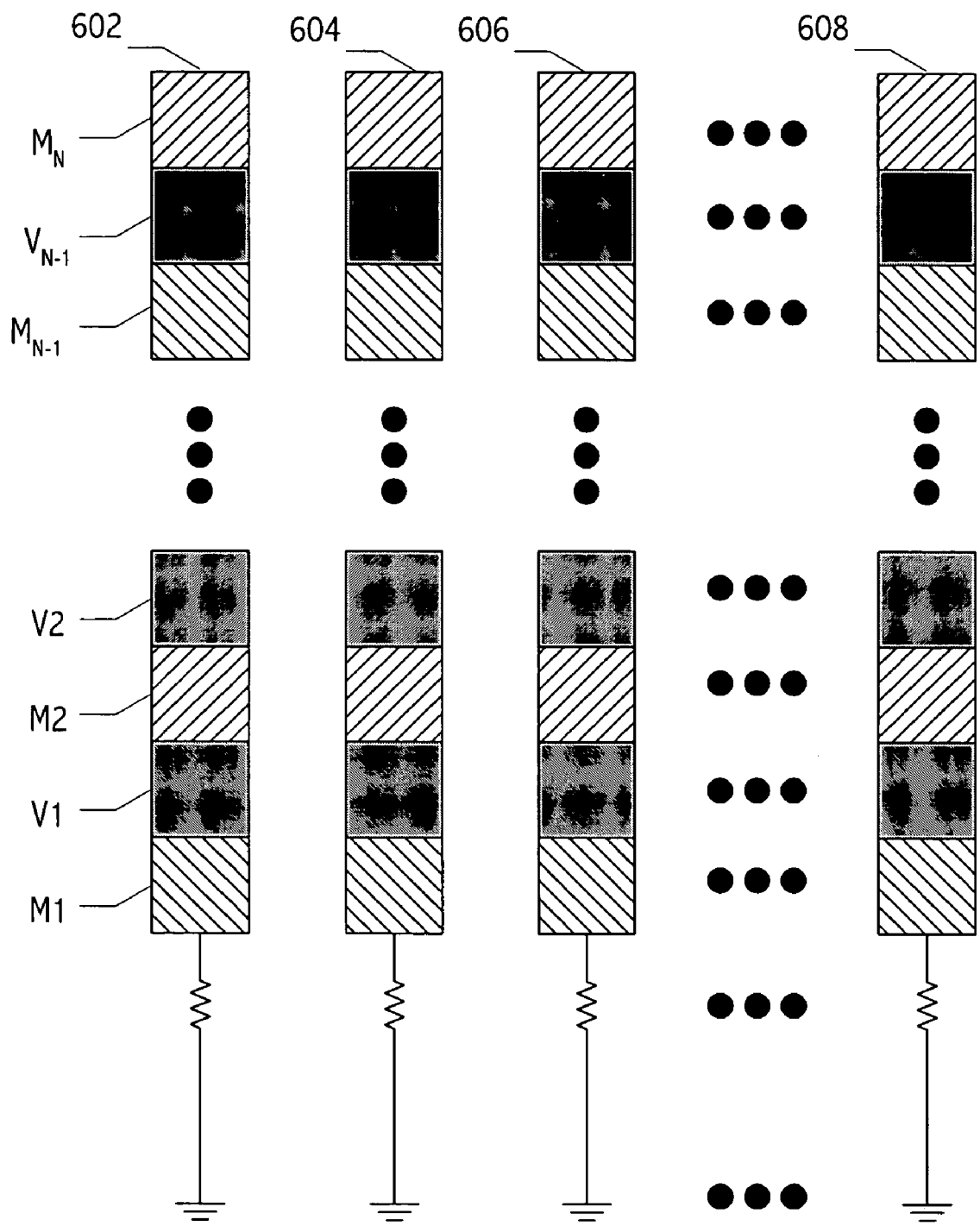
FIG. 6 illustrates a cross-sectional view of an exemplary integrated circuit structure in accordance with an embodiment of the present invention.

FIG. 5 illustrates an improved technique for providing a transition region that addresses defects associated with regions of low metal density adjacent to regions of high metal density. In an exemplary embodiment of the present invention, a plurality of transition regions, e.g., transition regions 502, 504, 506, and 508, each include a plurality of metal island structures 503 that are electrically isolated from each other so as to prevent the flow of any induced current. Transition regions 502, 504, 506, and 508 may be provided between a region of low metal density and the region of high metal density. Note that transition regions are typically present in multiple integrated circuit metal layers but are not necessarily required in the metal layer or layers that includes the inductor. A transition region should be utilized on each metal layer that has high density metal regions that could be adversely affected by regions of adjacent low metal density regions.

Individual transition regions 502, 504, 506, and 508 may reside any suitable distance D2 from a projected outer edge of inductor 106. For example, transition regions 502, 504, 506, and 508 may extend through M1-M8, or any combination thereof, below inductor 106, aligned with the an outer edge of inductor 106, i.e., D2=0. In other embodiments, transition regions 502, 504, 506, and 508 may be placed between a projected outer edge of inductor 106 and regions of high metal density 102a, 102b, 102c, and 102d, respectively, i.e., D2>0. In still other embodiments, transition regions 502, 504, 506, and 508 may reside within a projected outer perimeter of the inductor 106, i.e., D2<0. Note that individual ones of transition regions 502, 504, 506, and 508 may extend through different ones of the metal layers and may be positioned independently, i.e., have distinct values for D2.

The transition regions are formed generally parallel to a direction of current flow in inductor 106 but the electrically isolated islands 503 prevent an induced current from flowing in the transition regions. Thus, transition regions 502, 504, 506, and 508 provide a protective barrier between the high metal density regions and low metal density regions such that manufacturing defects in edge regions of high metal density regions caused by proximity to low metal density regions are substantially reduced or eliminated. The transition region should be formed with a high metal density to function well as a transition region. Thus, a metal density of approximately 50% or greater may be desirable in a particular semiconductor manufacturing process. In fact, the maximum, or close to the maximum possible metal density in the particular manufacturing process, may be desirable in the transition region.

Although four regions of high metal density (e.g., 102a, 102b, 102c, and 102d) and corresponding transitional regions (e.g., transitional regions 502, 504, 506, and 508) are illustrated, placement of the inductor on an integrated circuit may result in fewer regions of high conductor density adjunct to low density regions and fewer transition regions may be used to achieve similar performance. Note that the need for transition regions may also be determined by the type of structures adjacent to the region of low metal density.

While the metal islands in the transition region are electrically isolated from one another, the metal islands may be coupled to one another in a vertical direction by conductive vias. For example, individual conductive structures 602, 604, 606, and 608 are formed of vertically coupled islands that are electrically isolated from others of conductive structures 602, 604, 606, and 608 and extend through one or more integrated circuit layers (e.g., $M_1, M_2, \ldots M_N$) coupled by conductive vias (e.g., $V_1, V_2, \ldots V_{N-1}$). Exemplary island structures are 2 μm wide and 2 μm apart, and are 12 μm long. However, the structures may have any suitable dimensions.

Conductive structures 602, 604, 606, and 608 generally do not conduct a substantial AC or DC current. However, in certain applications, it may be undesirable to leave substantial metal structures floating in case they adversely affect performance of active circuits in the integrated circuit. Accordingly, in one embodiment of the present invention, individual ones of the metal islands, e.g., conductive structures 602, 604, 606, and 608, are coupled to a ground (or other known potential) through a high-impedance resistor to prevent current flow but maintain the islands in the transition region at a known potential. Note that the length of individual ones of conductive structures 602, 604, 606, and 608 is formed in a direction perpendicular to current flow in the inductor to reduce the impact of any electromagnetic fields corresponding to a current that may be induced in these structures in response to the inductor or otherwise.

Referring again to FIG. 5, because no current is induced in the transition region 502 to significantly affect inductor performance, the transition region 502 may be formed closer to the inductor than in the implementation including substantially solid conductive structures, illustrated in FIG. 4. For example, simulations of an exemplary embodiment of the invention indicate no degradation in performance of the inductor using a transition region in accordance with FIG. 5. Thus, the distance D2 between the inductor and the transition region shown in FIG. 5 may be less than the distance D1 shown in FIG. 4. That allows more of the integrated circuit die to be utilized, without inducing a current in the transition region that generates an electromagnetic field reducing a quality factor associated with inductor 106, changing the effective inductance of inductor 106, or otherwise affecting performance of inductor 106.

Although the invention is described with reference to inductor structures, the invention is not limited hereto. The inductor may be any circuit element that substantially degrades circuit performance if affected by electromagnetic signals from proximate conductive structures and typically result in inclusion of an area of low metal density proximate to the circuit element.

While circuits and physical structures are generally presumed, it is well recognized that in modem semiconductor design and fabrication, physical structures and circuits may be embodied in computer readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

What is claimed is:

1. An integrated circuit comprising:
    a substrate;
    a plurality of integrated circuit layers formed above the substrate;
    an inductor at least partially formed in another integrated circuit layer above the substrate;
    at least one region of low conductor density vertically displaced from the inductor and including at least one portion of each of the plurality of integrated circuit layers;
    at least one transitional region including at least one portion of each of the plurality integrated circuit layers, the at least one transitional region disposed adjacent to the at least one region of low conductor density in each of the integrated circuit layers;
    at least one region of high conductor density including at least one portion of each of the plurality of integrated circuit layers, the at least one region of high conductor density disposed adjacent to the at least one transitional region, the at least one transitional region disposed between the at least one region of low conductor density and the at least one region of high conductor density; and
    a plurality of conductive structures formed in the at least one transitional region, the plurality of conductive structures being electrically isolated from each other;
    wherein the inductor is vertically displaced from the plurality of integrated circuit layers including the at least one region of low conductor density, the at least one region of high conductor density, and the at least one transitional region;
    wherein the at least one region of high conductor density has a conductor density in the range of 20% to 80%, wherein the at least one region of low conductor density is substantially void of conductive structures.

2. The integrated circuit, as recited in claim 1, wherein individual one of the plurality of conductive structures includes respective conductive structures in one of the plurality of integrated circuit layers, which are electrically isolated from each other, and are electrically coupled to respective conductive structures in one or more other integrated circuit layers of the plurality of integrated circuit layers, the conductive structures being electrically isolated from each other, to form vertical conductive structures electrically isolated from each other.

3. The integrated circuit, as recited in claim 2, wherein at least one of the vertical conductor structures is coupled to a fixed potential through a high impedance structure.

4. The integrated circuit, as recited in claim 1, wherein at least one of the conductor structures is coupled to a fixed potential through a high impedance structure.

5. The integrated circuit, as recited in claim 1, wherein the at least one transitional region comprises:
    at least one transitional region that extends from the inductor in a first direction; and
    at least one transitional region that extends from the inductor in a second direction.

6. The integrated circuit, as recited in claim 1, wherein the at least one transitional region extends parallel to a direction of current in the inductor.

7. The integrated circuit, as recited in claim 1, wherein the at least one transitional region is proximate to a projected edge of the inductor.

8. The integrated circuit, as recited in claim 7, wherein the at least one transitional region is between the at least one region of high conductor density and the projected edge of the inductor.

9. The integrated circuit, as recited in claim 7, wherein the at least one transitional region is within a projected perimeter of the inductor.

10. The integrated circuit, as recited in claim 1, wherein the at least one transitional region is at least partially underneath the inductor.

11. The integrated circuit, as recited in claim 1, wherein the at least one transitional region has a conductor density of at least approximately 50%.

12. The integrated circuit, as recited in claim 1, wherein a quality factor associated with the inductor is not substantially degraded by inclusion of the at least one transitional region.

13. The integrated circuit, as recited in claim 1, wherein inductance of the inductor is not substantially degraded by inclusion of the at least one transitional region.

14. The integrated circuit, as recited in claim 1, wherein performance of the inductor is not substantially degraded by inclusion of the at least one transitional region.

15. An apparatus comprising:
    a substrate;
    a plurality of integrated circuit layers formed above the substrate;
    an inductor at least partially formed in another integrated circuit layer above the substrate;
    at least one region of low conductor density vertically displaced from the inductor and including at least one portion of each of the plurality of integrated circuit layers;
    at least one region of high conductor density including at least one portion of each of the plurality of integrated circuit layers; and at least one means for protecting from manufacturing defects the at least one region of high conductor density, the means for protecting being formed in the plurality of integrated circuit layers and formed proximate to the at least one region of low conductor density, the means for protecting inducing substantially no current in response to an electromagnetic field generated by the inductor, wherein the inductor is vertically displaced from the plurality of integrated circuit layers including the at least one region of low conductor density, the at least one region of high conductor density, and the at least one means from protecting;

wherein the at least one region of high conductor density includes conductive layers having conductor density in the range of 20% to 80%, wherein the at least one region of low conductor density is void of conductive structures.

16. The apparatus, as recited in claim 15, wherein the at least one means for protecting is proximate to a projected outer edge of the inductor.

17. The apparatus, as recited in claim 15, further comprising:
means for setting at least one potential of the at least one means for protecting to a known voltage.

18. The integrated circuit, as recited in claim 1, wherein the inductor is formed entirely above the plurality of integrated circuit layers and the at least one region of low conductor density is formed between the inductor and the substrate.

19. An integrated circuit comprising:
a substrate;
plurality of integrated circuit layers formed above the substrate;
an inductor at least partially formed in another integrated circuit layer above the substrate;
at least one region of low conductor density vertically displaced from the inductor and including at least one portion of each of the plurality of integrated circuit layers;
at least one transitional region including at least one portion of each of the plurality of integrated circuit layers, the at least one transitional region disposed adjacent to the at least one region of low conductor density in each of the integrated circuit layers;
at least one region of high conductor density including at least one portion of each of the plurality of integrated circuit layers, the at least one region of high conductor density disposed immediately adjacent to the at least one transitional region, the at least one transitional region disposed immediately adjacent to the at least one region of low conductor density and disposed between the at least one region of low conductor density and the at least one region of high conductor density; and
a plurality of conductive structures formed in the at least one transitional region, the plurality of conductive structures being electrically isolated from each other;

wherein the inductor is vertically displaced from the plurality of integrated circuit layers including the at least one region of low conductor density, the at least one region of high conductor density, and the at least one transitional region;

wherein the at least one region of high conductor density has a conductor density in the range of 20% to 80%, wherein the at least one region of low conductor density is substantially void of conductive structures.

20. The integrated circuit, as recited in claim 19, wherein the inductor, the at least one region of high conductor density, and the at least on region of low conductor density are formed on a single integrated circuit substrate.

21. The integrated circuit, as recited in claim 1, wherein no substantial current flows in the at least one transitional region.

22. The integrated circuit, as recited in claim 19, wherein no substantial current flows in the at least one transitional region.

23. The apparatus, as recited in claim 15, wherein the inductor, the at least one region of high conductor density, the at least one region of low conductor density, and the at least one means for protecting are formed on a single integrated circuit substrate.

24. The apparatus, as recited in claim 15, wherein the at least one means for protecting includes a plurality of conductive structures electrically isolated from each other.

25. The apparatus, as recited in claim 23, wherein the inductor is formed in at least a first integrated circuit layer above the plurality of integrated circuit layers and the at least one region of low conductor density is formed between the inductor and the integrated circuit substrate.

26. The integrated circuit, as recited in claim 19, wherein the inductor is formed in at least a first integrated circuit layer above the plurality of integrated circuit layers and the at least one region of low conductor density is formed between the inductor and a substrate of the integrated circuit.

27. The integrated circuit, as recited in claim 1, wherein the inductor is formed entirely above the at least one region of low conductor density.

28. The integrated circuit, as recited in claim 1, wherein the inductor is formed at least partially above the at least one transitional region.

29. The apparatus, as recited in claim 15, wherein the inductor is formed entirely above the at least one region of low conductor density.

30. The apparatus, as recited in claim 15, wherein the inductor is formed at least partially above the at least one means for protecting.

31. The integrated circuit, as recited in claim 19, wherein the inductor is formed entirely above the at least one region of low conductor density.

32. The integrated circuit, as recited in claim 19, wherein the inductor is formed at least partially above the at least one transitional region.

* * * * *

UNITED STATES PATENT AND TRADEMARK OFFICE
CERTIFICATE OF CORRECTION

| | |
|---|---|
| PATENT NO. | : 7,375,411 B2 |
| APPLICATION NO. | : 10/860081 |
| DATED | : May 20, 2008 |
| INVENTOR(S) | : Ligang Zhang |

It is certified that error appears in the above-identified patent and that said Letters Patent is hereby corrected as shown below:

Column 5, line 46, please replace "plurality integrated" with --plurality of integrated--
Column 6, line 4 claim 2, please replace "one of" with --ones of--
Column 7, line 33 claim 19, please replace "plurality" with --a plurality--
Column 8, line 12 claim 20, please replace "at least on" with --at least one--

Signed and Sealed this

Twelfth Day of August, 2008

JON W. DUDAS
*Director of the United States Patent and Trademark Office*